(12) United States Patent  
Zhang et al.

(10) Patent No.: US 7,778,021 B2
(45) Date of Patent: Aug. 17, 2010

(54) MOUNTING ASSEMBLY FOR STORAGE DEVICE

(75) Inventors: Jun-Xiong Zhang, Shenzhen (CN); Wen-Tang Peng, Taipei Hsien (TW); Zhi-Xin Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 47 days.

(21) Appl. No.: 12/198,049

(22) Filed: Aug. 25, 2008

(65) Prior Publication Data

US 2009/0290311 A1 Nov. 26, 2009

(30) Foreign Application Priority Data

May 21, 2008 (CN) .................. 2008 1 0301712

(51) Int. Cl.
*H05K 5/00* (2006.01)
*H05K 7/00* (2006.01)

(52) U.S. Cl. .................. 361/679.33; 361/679.31; 361/679.58

(58) Field of Classification Search ............. 361/679.31, 361/679.33, 679.58
See application file for complete search history.

(56) References Cited

U.S. PATENT DOCUMENTS 6,293,636 B1 * 9/2001 Le et al. .................. 312/223.2

* cited by examiner

*Primary Examiner*—Jayprakash N Gandhi
*Assistant Examiner*—Anthony M Haughton
(74) *Attorney, Agent, or Firm*—Zhigang Ma

(57) ABSTRACT

A mounting assembly includes first and second brackets. The first bracket is capable of receiving storage devices therein, and includes a first board. The first board includes a first end, and a blocking piece. The second bracket is capable of receiving storage devices therein, and includes a second board. The second board includes a first protrusion, and a second protrusion. The second board has first and second positions. At the first position, the second bracket is received in the first bracket, the first end engages with the first protrusion to prevent the second bracket form moving toward a first direction, and the blocking piece engages with the second protrusion to prevent the second bracket form moving toward a second direction opposite to the first direction. At the second position, the second bracket is departed from the first bracket.

18 Claims, 4 Drawing Sheets

MOUNTING ASSEMBLY FOR STORAGE DEVICE

BACKGROUND

1. Field of the Invention

The present invention relates to mounting assemblies and, more particularly, to a mounting assembly for storage devices.

2. Description of Related Art

A computer, such as a typical desktop computer, a tower computer, a server, and the like, usually includes storage devices, such as hard disk drives (HDDs). In using a computer, especially a server, different kinds of HDDs may be needed, each having a different size. Some standard HDD sizes include 2.5 inches, 3.5 inches, and so on. Thus, mounting assemblies capable of mounting different HDDs to a computer are needed.

DETAILED DESCRIPTION

Figure 1:
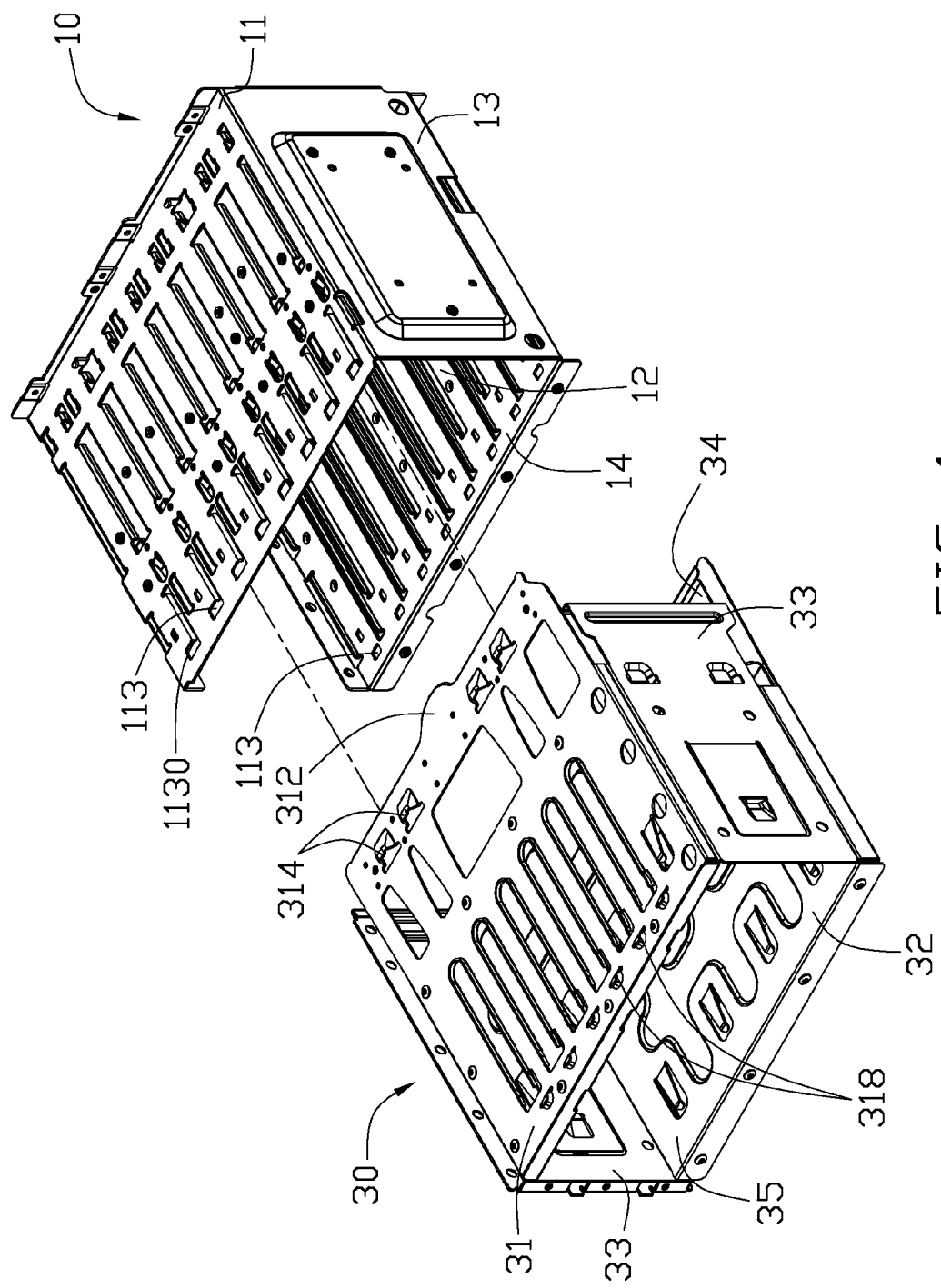
FIG. 1 is an exploded, isometric view of a mounting assembly in accordance with an embodiment of the present invention.
Figure 2:
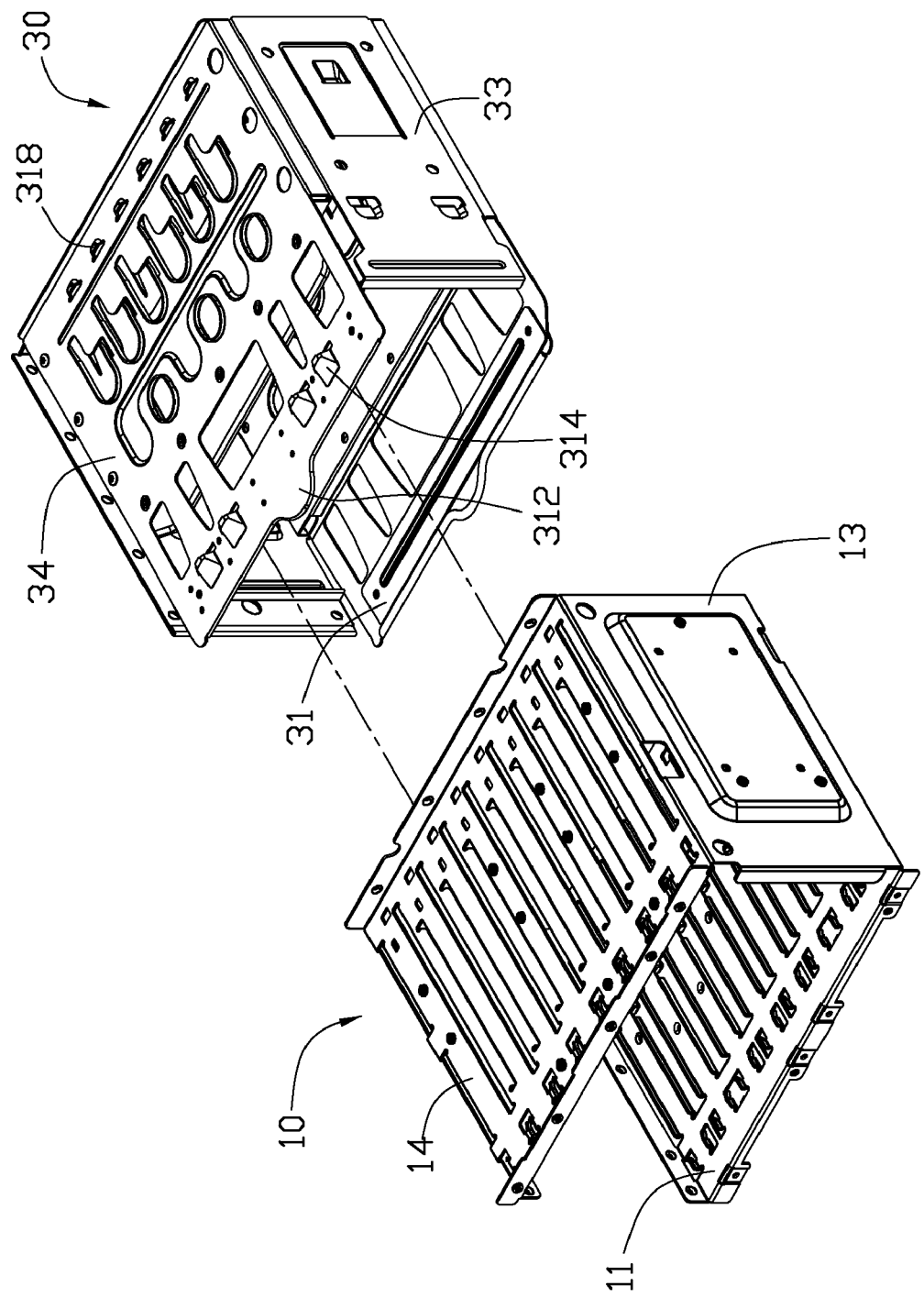
FIG. 2 is an exploded, isometric view of the mounting assembly of FIG. 1, viewed from a second aspect.

Referring to FIGS. 1 and 2, a mounting assembly is provided in accordance with an embodiment of the present invention. The mounting assembly includes a first bracket 10, and a second bracket 30.

The first bracket 10 is mounted to a computer case (not shown) by any known means such as with screw fasteners, and can be used alone to mount a plurality of large HDDs to the computer case. Alternatively, the second bracket 30 can be mounted inside the first bracket 10 in order to mount a plurality of small HDDs to the computer case.

The first bracket 10 includes opposite first and second boards 11, 14, and a third board 13 perpendicularly joining corresponding sides of the first and second boards 11, 14. An receiving space 12 bounded by the boards 11, 13, 14 is defined. A plurality of rectangular holes 113 is defined in the first and second boards 11, 14 adjacent the front end (see FIG. 1) of the first bracket 10. A plurality of blocking pieces 1130 extends from the first board 11 towards inside the first bracket 10. Each blocking piece 1130 is adjacent one of the holes 113 of the first board 11 respectively.

The second bracket 30 includes opposite fourth and fifth boards 31, 34, and two opposite sixth boards 33 joining corresponding sides of the fourth and fifth boards 11, 14 respectively. A seventh board 35 covers the fifth board 34 from inside the bracket 30. The boards 31, 33 and 35 collectively define a space for receiving a plurality of small HDDs. The rear end (see FIG. 1) of each of the fourth and fifth boards 31, 34 is elastically deformable, and has an operating portion 312 extending from an edge thereof, and a plurality of generally wedge-shaped first protrusions 314 extending from the outer surface thereof. Each first protrusion 314 includes a slanted guiding portion facing the adjacent rear edge, and a blocking end facing the opposite direction. Each of the fourth and fifth boards 31, 34 includes a plurality of generally wedge-shaped second protrusions 318 extending from the outer surface thereof adjacent the front end. The second protrusions 318 each include a blocking end.

Figure 3:
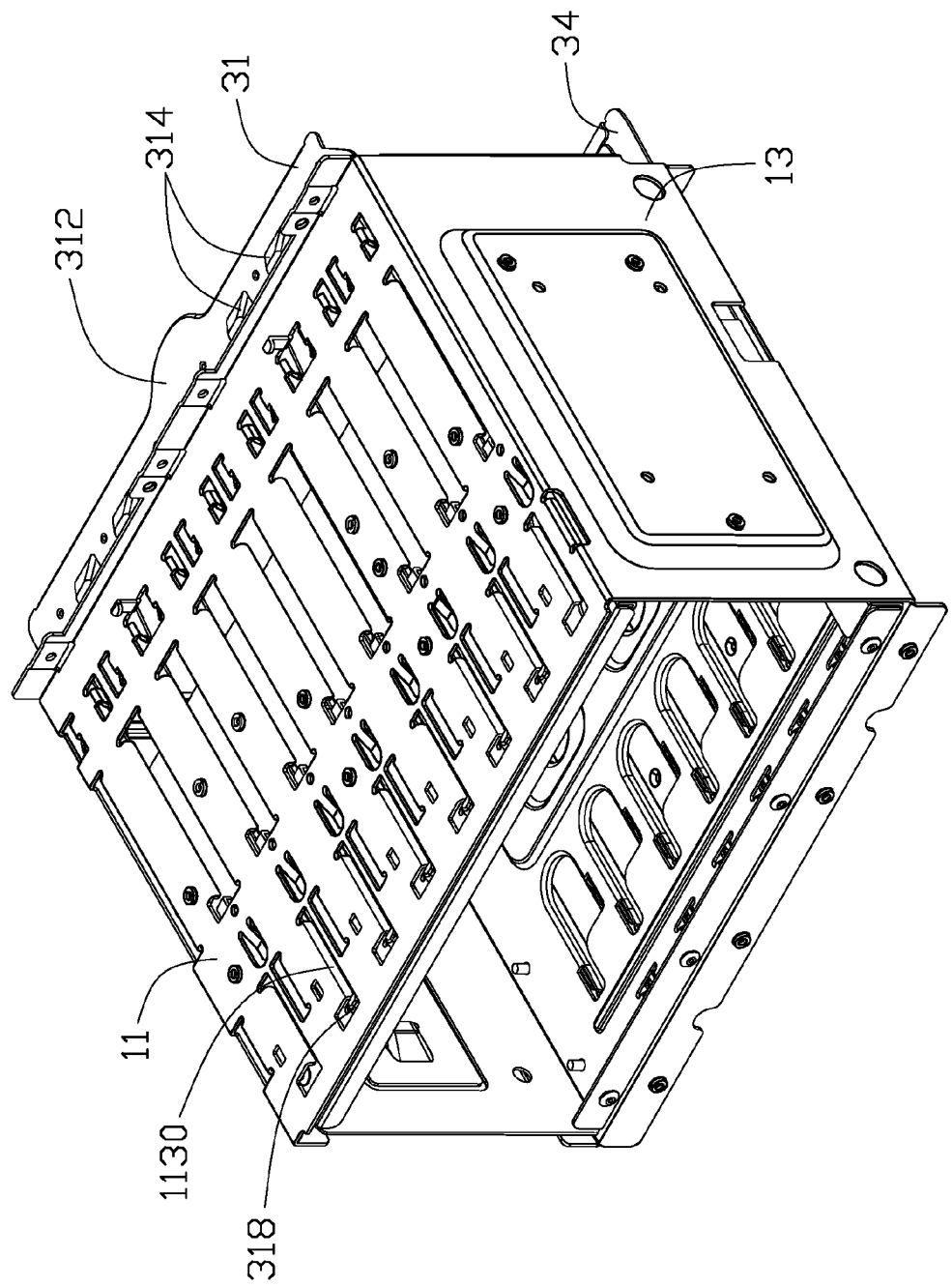
FIG. 3 is an assembled view of the mounting assembly of FIG. 1.
Figure 4:
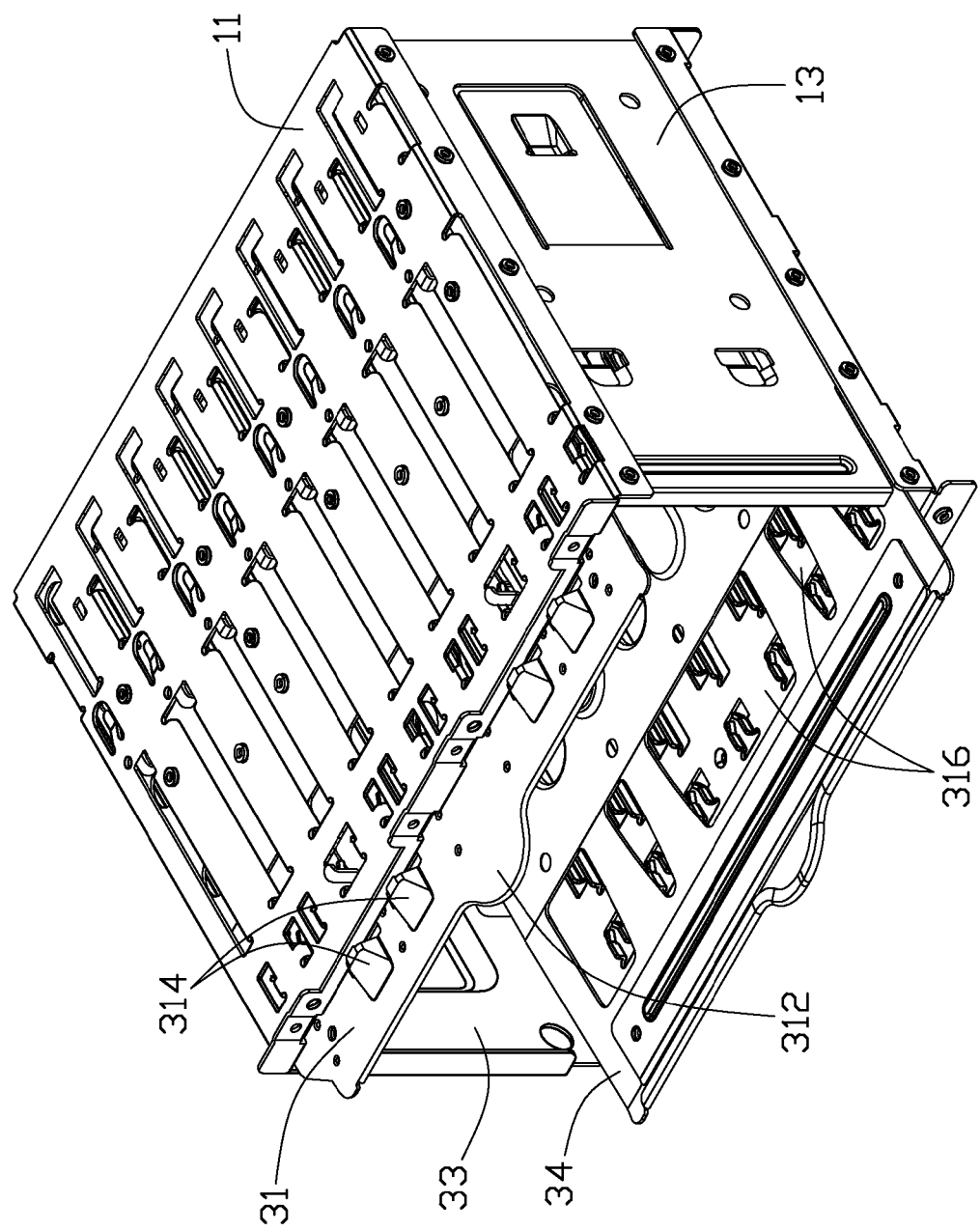
FIG. 4 is an assembled view of the mounting assembly, similar to FIG. 3, but viewed from a third aspect.

Referring also to FIGS. 3 and 4, in assembling the second bracket 30 in the first bracket 10, the rear ends (see FIG. 1) of the fourth and fifth boards 31, 34 are pressed and deformed toward each other, so as to be inserted into the receiving space 12 from the front end of the first bracket 10. Then the second bracket 30 is further pushed inside the receiving space 12, and the rear ends of the fourth and fifth boards 31, 34 is slid in the first bracket 10 with guiding help of the slanted guiding portions of the first protrusions 314, until the first protrusions 314 go through the receiving space 12 exposing out from the rear end of the first bracket 10. Then the forms of rear ends of the fourth and fifth boards 31, 34 are restored, the blocking ends of the first protrusions 314 urge against the corresponding edges of the first and second boards 11, 14, and the blocking end of the second protrusions 318 of the fourth board 31 urge against the ends of the corresponding blocking piece 1130. Wherein the engagement between the first protrusions 314 and the edges of the first and second boards 11, 14 can prevent the second bracket 30 from sliding toward the front end (see FIGS. 1 and 3) of the first bracket 10, and the engagement between the second protrusions 318 and the blocking pieces 1130 can prevent the second bracket 30 from sliding toward the rear end of the first bracket 10. Thus, the second bracket 30 is firmly mounted to the first bracket 10 and ready to receive a plurality of small HDDs.

In disassembly, the operating portion 312 are pressed toward each other, and the rear end (see FIGS. 1 and 3) of the second bracket 30 is pushed. Then, the second bracket 30 can be easily slid out of the receiving space 12 of the first bracket 10.

In use, if small size HDDs are to be mounted, the assembled mounting assembly can be used; or if large size HDDs are to be mounted, the second bracket 30 can be disassembled, and the first bracket 10 can be used alone.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting assembly comprising:
   a first bracket forming a receiving space, and comprising a first board which includes two opposite first end and second end and forms a surface of the receiving space, and at least one blocking piece formed on the first board and adjacent to the second end of the first board and extending towards inside of the receiving space; and
   a second bracket capable of being received in the receiving space and receiving storage devices therein, and comprising a second board with two opposite third end and fourth end, and at least one first protrusion adjacent to the third end and at least one second protrusion adjacent to the fourth end, the third end of the second board comprises an elastically deformable portion extending from the second board away from the fourth end of the second board along a direction substantially parallel to the second board, the at least one first protrusion extends from the deformable portion; wherein the second bracket is able to slide into the receiving space of the first bracket to such a position that the first end of the first board engages with the at least one first protrusion to prevent the second bracket from moving backward and the at least one blocking piece engages with the at least one second protrusion to prevent the second bracket from moving further forward.

2. The mounting assembly as claimed in claim 1, wherein when the deformable portion is pressed, the at least one first protrusion is capable of disengaging from the first end of the first board.

3. The mounting assembly as claimed in claim 2, wherein an operating portion extends from the deformable portion away from the fourth end of the second board along a direction substantially parallel to the second board for facilitating operating.

4. The mounting assembly as claimed in claim 1, wherein the at least one first protrusion is generally wedge-shaped.

5. The mounting assembly as claimed in claim 4, wherein each of the at least one first protrusion comprises a blocking end facing the fourth end, and a slanted guiding portion opposite to the blocking end, wherein when the second bracket is slid into the receiving space of the first bracket, the slanted guiding portion of each of the at least one protrusion engages with the first board of the first bracket to urge the deformable portion to elastically deform until the at least one first protrusion goes through the receiving space of the first bracket, and when the at least one first protrusion goes through the receiving space, the deformable portion restores, the blocking end of each of the at least one first protrusion faces and abuts against the first end of the first board, and the slanted guiding portion of each of the at least one first protrusion is opposite to the first end of the first board.

6. The mounting assembly as claimed in claim 1, wherein the at least one second protrusion is generally wedge-shaped.

7. The mounting assembly as claimed in claim 6, wherein the at least one second protrusion comprises a blocking end.

8. The mounting assembly as claimed in claim 1, wherein the first bracket further comprises third and fourth boards, the third board is opposite to the first board, the fourth board joins corresponding sides of the first and third boards perpendicularly, the first, third and the fourth boards cooperatively forming the receiving space.

9. A mounting assembly comprising:
a first bracket comprising a first end, and a blocking piece; and
a second bracket detachably received in the first bracket, and capable of receiving a storage device of a first size therein, wherein the second bracket comprises an elastically deformable second end, a first protrusion extending from the second end, and a second protrusion;
wherein the first end engages with the first protrusion to prevent the second bracket from moving toward a first direction, the blocking piece engages with the second protrusion to prevent the second bracket from moving toward a second direction opposite to the first direction;
wherein when the second bracket is detached from the first bracket, the first bracket is capable of receiving a storage device of a second size therein, wherein the second size is different from the first size.

10. The computer as claimed in claim 9, wherein an operating portion extends from the second end for facilitating operating.

11. The computer as claimed in claim 9, wherein the first and second protrusion extends from an outer surface of the second bracket, the blocking piece extends in the first bracket.

12. The computer as claimed in claim 11, wherein the second bracket comprises a first board, the second end extends from the first board.

13. The computer as claimed in claim 12, wherein the second protrusion extends from the first board.

14. The computer as claimed in claim 13, wherein the first bracket comprises a second board, the first end and the blocking piece extend from the second board.

15. The mounting assembly as claimed in claim 9, wherein the first protrusion is generally wedge-shaped.

16. The mounting assembly as claimed in claim 15, wherein the first protrusion comprises a slanted guiding portion, and a blocking end.

17. The mounting assembly as claimed in claim 9, wherein the second protrusion is generally wedge-shaped.

18. The mounting assembly as claimed in claim 17, wherein the second protrusion comprises a blocking end.

* * * * *